(12) United States Patent
Inuiya

(10) Patent No.: US 7,445,947 B2
(45) Date of Patent: Nov. 4, 2008

(54) METHOD OF MANUFACTURING SOLID-STATE IMAGING DEVICE AND SOLID-STATE IMAGING DEVICE

(75) Inventor: Masafumi Inuiya, Ashigarakami (JP)

(73) Assignee: FUJIFILM Corporation, Tokyo (JP)

( * ) Notice: Subject to any disclaimer, the term of this patent is extended or adjusted under 35 U.S.C. 154(b) by 49 days.

(21) Appl. No.: 11/709,782

(22) Filed: Feb. 23, 2007

(65) Prior Publication Data
US 2007/0202696 A1    Aug. 30, 2007

(30) Foreign Application Priority Data
Feb. 23, 2006    (JP) .............................. 2006-047152

(51) Int. Cl.
*H01L 21/00*    (2006.01)
(52) U.S. Cl. ................. 438/22; 257/290; 257/E21.532; 257/E25.023
(58) Field of Classification Search ................... 438/22; 257/21, 80, 184, 290
See application file for complete search history.

(56) References Cited

U.S. PATENT DOCUMENTS 7,268,369 B2 *    9/2007    Araki .......................... 257/83

FOREIGN PATENT DOCUMENTS

| JP | 2002-502120 A | 1/2002 |
|---|---|---|
| JP | 2002-83946 A | 3/2002 |
| WO | WO 99/39372 A2 | 8/1999 |

\* cited by examiner

*Primary Examiner*—Quoc D Hoang
(74) *Attorney, Agent, or Firm*—Sughrue Mion, PLLC

(57) ABSTRACT

After electrode pads 20 formed on a silicon substrate 1 and an electrode 21 to be connected thereto are exposed, a photoelectric conversion layer 12 is formed via a first mask 23 which covers exposed surfaces of the electrode pads 20 and the electrode 21. Then, a second electrode 13 is formed on a third electrode via a second mask 26 in which an opening is formed. This establishes a connection between the second electrode 13 and the electrode pads 20.

14 Claims, 10 Drawing Sheets

METHOD OF MANUFACTURING SOLID-STATE IMAGING DEVICE AND SOLID-STATE IMAGING DEVICE

BACKGROUND OF THE INVENTION

1. Technical Field

The invention relates to a manufacturing method of a solid-state imaging device configured so that one photoelectric conversion layer is laminated above a semiconductor substrate.

2. Description of the Related Art

In a single-plate-type color solid-state imaging device as represented by CCD-type or CMOS-type image sensors, three kinds or four kinds of color filters are arranged in a mosaic shape on an array of light-receiving sections, which perform photoelectric conversion. Accordingly, color signals corresponding to the color filters are output from the light-receiving sections, respectively, and these color signals are processed to generate a color image.

However, the color solid-state imaging device in which the color filters are arranged in a mosaic shape is not good in light use efficiency and has low sensitivity because about $2/3$ of incident light will be absorbed by the color filters when they are color filters for primary colors. Further, since only one color signal is acquired by each light-receiving section, resolution is not good, and particularly, false color may become conspicuous.

Therefore, in order to overcome the problems, an imaging device having such a structure that three photoelectric conversion layers are laminated on a semiconductor substrate formed with a signal read circuit has been studied and developed (for example, see JP 2002-502120 T (corresponding to WO99/39372 A2) and JP 2002-83946 A). This imaging device has, for example, such a structure of a light-receiving section that photoelectric conversion layers, which generate signal charges (electrons, holes) with respect to red (R), blue (B), and green (G) light components, are overlapped on each other sequentially from a light incidence plane and that each photoelectric conversion layer is provided with a signal read circuit, which can independently read a signal charge generated in each photoelectric conversion layer.

In the imaging device having such a structure, most of incident light is photo-electrically converted and is read and thus, the use efficiency of visible light is close to 100%. Also, color signals for three colors of R, G, and B are acquired by the light-receiving sections, respectively. Therefore, a good image with high sensitivity and with high resolution can be created (false color is not conspicuous).

In order to actually achieve imaging devices as described in JP 2002-502120 T and JP 2002-83946 A, a photoelectric conversion section formed above a semiconductor substrate is configured as follows, for example. That is, a large number of photoelectric conversion sections are arranged on the same plane above the semiconductor substrate. Each of the photoelectric conversion sections includes a first electrode laminated above the semiconductor substrate, a photoelectric conversion layer formed on the first electrode, and a second electrode formed on the photoelectric conversion layer. The first electrode is partitioned for each of the large number of photoelectric conversion sections. The photoelectric conversion layer and the second electrode are common to the large number of photoelectric conversion sections.

In such a solid-state imaging device having the large number of photoelectric conversion sections, it is necessary to provide an electrode pad for connecting a power source to the solid-state imaging device as in a single plate-type solid-state imaging device. In the single plate-type solid-state imaging device, after the electrode pad is formed on the semiconductor substrate, an opening is formed in the electrode pad by photolithography technique to expose the electrode pad whenever a laminate (e.g., a color filter and a micro lens) is formed on the semiconductor substrate.

Even in the above solid-state imaging device having the large number of photoelectric conversion sections, it is necessary to expose the electrode pad. However, the photoelectric conversion layer made of an organic material is weak against heat or moisture as with the single plate-type solid-state imaging device. Thus, when a process of forming an opening in the electrode pad by the photolithography technique is employed whenever a laminate (e.g., the first electrode, the photoelectric conversion layer and the second electrode) is formed on the semiconductor substrate, the performance of the photoelectric conversion layer may be degraded. Further, in the solid-state imaging device having the large number of photoelectric conversion sections, when the second electrode is formed, it is necessary to form wiring lines for connecting the second electrode to the electrode pads. Since the second electrode itself is configured as one sheet common to each photoelectric conversion section, the photolithography technique is unnecessary, but it may become necessary to pattern wiring lines for connecting the second electrode to the electrode pads by the photolithography technique. As described above, in the solid-state imaging device having the large number of photoelectric conversion sections, after the photoelectric conversion layer is formed, it is important to expose the electrode pads and to form the wiring lines between the second electrode and the electrode pads without using the photolithography technique becomes in order to prevent degradation of the performance of the photoelectric conversion layer.

SUMMARY OF THE INVENTION

In view of the above circumstances, the invention has been made and provides a method of manufacturing a solid-state imaging device configured so that one photoelectric conversion layer is laminated above a semiconductor substrate, the method which can prevent degradation of the performance of the photoelectric conversion layer.

According to an aspect of the invention, a method of manufacturing a solid-state imaging device in which a large number of photoelectric conversion sections each comprising a first electrode laminated above a substrate, a photoelectric conversion layer formed on the first electrode, and a second electrode formed on the photoelectric conversion layer are arranged on a same plane above the substrate, wherein: the first electrode is partitioned for each of the large number of photoelectric conversion sections, the second electrode is common to the large number of photoelectric conversion sections, the solid-state imaging device in plan view has a photoelectric conversion region in which the photoelectric conversion sections are formed, and a pad region in which a large number of electrode pads for connecting a power source to the solid-state imaging device are formed, and the large number of electrode pads include a pad for the second electrode that connects the power source to the second electrode, and other electrode pads, the manufacturing method includes: forming the first electrode above the substrate; forming on the substrate the pad for the second electrode so that at least a portion of the pad for the second electrode is exposed; forming the photoelectric conversion layer on the first electrode via a first mask that covers at least the exposed surface of the pad for the second electrode in regions other than the photoelectric conversion region.

Also, the method may further include forming the other electrode pads on the substrate so that at least portions of the other electrode pads are exposed. The forming of the photoelectric conversion layer may form the photoelectric conversion layer with using, as the first mask, a mask that at least covers the exposed surface of the pad for the second electrode and the exposed surfaces of the other electrode pads in the regions other than the photoelectric conversion region. The method may further include after the forming of the photoelectric conversion section, forming the second electrode on the photoelectric conversion layer and on at least a portion of the exposed surface of the pad for the second electrode, via a second mask that at least covers the exposed surfaces of the other electrode pads in the regions other than the photoelectric conversion region and other than at least a portion of the exposed surface of the pad for the second electrode.

According to another aspect of the invention, a method of manufacturing a solid-state imaging device in which a large number of photoelectric conversion sections each comprising a first electrode laminated above a substrate, a photoelectric conversion layer formed on the first electrode, and a second electrode formed on the photoelectric conversion layer are arranged on a same plane above the substrate, wherein: the first electrode is partitioned for each of the large number of photoelectric conversion sections, the second electrode is common to the large number of photoelectric conversion sections, the solid-state imaging device in plan view has a photoelectric conversion region in which the photoelectric conversion sections are formed, a pad region in which a large number of electrode pads for connecting a power source to the solid-state imaging device are formed, and a boundary region between the photoelectric conversion region and the pad region, and the large number of electrode pads include a pad for the second electrode that connects the power source to the second electrode, and other electrode pads, the method includes: forming the first electrode above the substrate; forming the large number of electrode pads on the substrate; forming a third electrode, which is to be electrically connected to the pad for the second electrode, on the substrate in the boundary region so that at least a portion of the third electrode is exposed; forming a separating member, which separates the photoelectric conversion region and the pad region, on the third electrode and the substrate in the boundary region so that the exposed surface of the third electrode exists between the separating member and the photoelectric conversion region in plan view; placing on the separating member a first mask that covers at least a portion of the exposed surface of the third electrode in regions other than the photoelectric conversion region; and forming the photoelectric conversion layer on the first electrode via the first mask.

Also, the forming of the electrode pads may form the large number of electrode pads so that at least a portion of each of the large number of electrode pads is exposed. The forming of the photoelectric conversion layer may form the photoelectric conversion layer on the first electrode with using, as the first mask, a mask that at least covers the third electrode and the exposed surfaces of the large number of electrode pads in the regions other than the photoelectric conversion region. The method may further include: after the forming of the photoelectric conversion layer, placing on the separating member a second mask that at least covers the exposed surfaces of the large number of electrode pads in the regions other than the photoelectric conversion region and other than at least a portion of the exposed surface of the third electrode between the separating member and the photoelectric conversion region; and forming the second electrode on the photoelectric conversion layer and on at least the portion of the exposed surface of the third electrode between the photoelectric conversion region and the separating member via the second mask.

Also, the pad region may include a first pad region and a second pad region, which face each other across the photoelectric conversion region. The method may further include forming a transparent protective member on the separating member formed in the boundary region so that the transparent protective member protects a region on a photoelectric-conversion-region side of the separating member.

Also, the method may further include: forming a plurality of the solid-state imaging devices in a same wafer; and dicing the wafer to separate the plurality of solid-state imaging devices.

Also, a metal may be used as the separating member.

According to still another aspect of the invention, a solid-state imaging device includes a substrate; and a large number of photoelectric conversion sections arranged on a same plane above the substrate. Each of the large number of photoelectric conversion sections includes: a first electrode laminated above the substrate; a photoelectric conversion layer formed on the first electrode; and a second electrode formed on the photoelectric conversion layer. The first electrode is partitioned for each of the large number of photoelectric conversion sections. The second electrode is common to the large number of photoelectric conversion sections. The solid-state imaging device in plan view has a photoelectric conversion region in which the photoelectric conversion sections are formed, a pad region in which a large number of electrode pads that connects a power source to the solid-state imaging device are formed, and a boundary region between the photoelectric conversion region and the pad region. The pad region has a first pad region and a second pad region, which face each other across the photoelectric conversion region. The boundary region has a first boundary region between the photoelectric conversion region and the first pad region and a second boundary region between the photoelectric conversion region and the second pad region. A pad for a second electrode that connects the power source to the second electrode is formed in each of the first pad region and the second pad region. The solid-state imaging device further includes: a third electrode formed on the substrate in the first boundary region, the third electrode electrically connected to the pad for the second electrode formed in the first pad region; a fourth electrode formed on the substrate in the second boundary region, the fourth electrode electrically connected to the pad for the second electrode formed in the second pad region; a first separating member formed on the third electrode and the substrate in the first boundary region to separate the photoelectric conversion region and the first pad region, wherein the first separating member is formed so that the third electrode exists between the first separating member and the photoelectric conversion region in plan view; a second separating member formed on the fourth electrode and the substrate in the second boundary region to separate the photoelectric conversion region and the second pad region, wherein the second separating member is formed so that the fourth electrode exists between the second separating member and the photoelectric conversion region in plan view; and a transparent protective member formed on the first separating member and the second separating member to protect a portion between the first separating member and the second separating member. The second electrode is formed so as to extend from an end of the photoelectric conversion region on a first-boundary-region side to the third electrode between the first separating member and the photoelectric conversion region. The second electrode is formed so as to extend from an end of the photoelectric conversion region on a second-boundary-region side to the fourth electrode between the second separating member and the photoelectric conversion region.

Also, the second electrode may be formed so as to extend from the end of the photoelectric conversion region on the first-boundary-region side to the third electrode between the first separating member and the photoelectric conversion region and to the first separating member. The second electrode may be formed so as to extend from the end of the photoelectric conversion region on the second-boundary-region side to the fourth electrode between the second separating member and the photoelectric conversion region and to the second separating member.

According to the above configuration, it is possible to provide a method of manufacturing a solid-state imaging device configured so that one photoelectric conversion layer is laminated above a semiconductor substrate, the method which can prevent degradation of the performance of the photoelectric conversion layer.

DETAILED DESCRIPTION OF EMBODIMENTS OF THE INVENTION

Hereinafter, an embodiment of the invention will be described with reference to the accompanying drawings.

Figure 1:
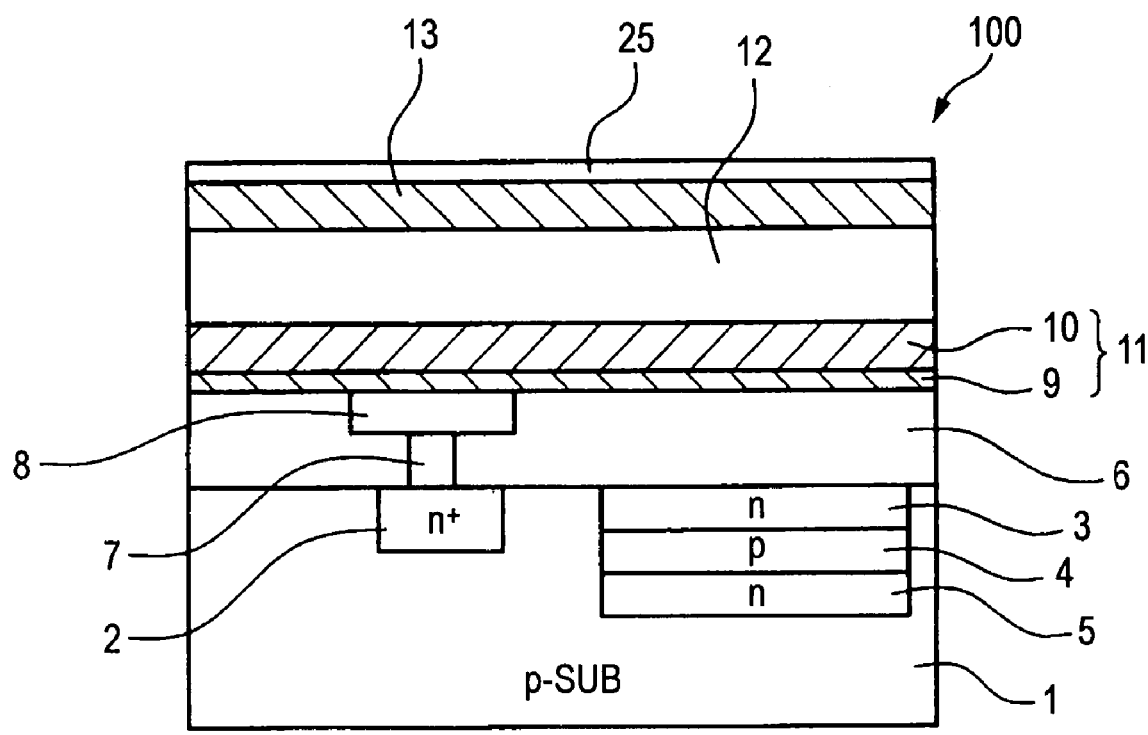
FIG. 1 is a section view showing the schematic configuration of a portion of a solid-state imaging device according to an embodiment of the invention.

FIG. 1 is a section view showing the schematic configuration of a portion of a solid-state imaging device to describe this embodiment. The solid-state imaging device 100 of this embodiment is configured such that large number of photoelectric conversion sections are arranged on the same plane above the p-type silicone substrate 1. Each photoelectric conversion section includes: a first transparent electrode 11, which is made of, for example, ITO and which is laminated above the p-type silicon substrate 1 serving as a substrate; a photoelectric conversion layer 12, which is formed on the first electrode 11 and which detects the wavelength of a green (G) light component of incident light; and a second transparent electrode 13, which is made of ITO and which is formed on the photoelectric conversion layer 12. A protective layer 25, which is made of a transparent insulating material and which protects the surface of the second electrode 13, is formed on the second electrode 13.

The first electrode 11 has two-layer structure of an electrode 9 and an electrode 10. However, the first electrode 11 may have a single-layer structure. The first electrode 11 is partitioned for each of the large number of photoelectric conversion sections. The photoelectric conversion layer 12 or the second electrode 13 is configured as one sheet common to the large number of photoelectric conversion sections. In addition, the photoelectric conversion layer 12 may be partitioned for each of the large number of photoelectric conversion sections.

The photoelectric conversion layer 12 may have a single-layer structure or a multilayer structure. The photoelectric conversion layer 12 is formed of an organic semiconductor material, which has sensitivity to mainly green, or an organic material, which contains organic dye and which has sensitivity to mainly green.

Within the p-type silicon substrate 1, a highly-doped n-type impurity region 2 (hereinafter referred to as "$n^+$ region 2") is formed corresponding to each of the large number of photoelectric conversion sections. On the $n^+$ region 2, a contact part 7 made of metal, such as aluminum or tungsten, for electrically connecting the $n^+$ region 2 to the first electrode 11 is formed. On the contact part 7, an adhesion layer 8 made of TiN or AlCu for ensuring the adhesiveness between the first electrode 11 and the contact part 7 is formed. The first electrode 11 is formed on the adhesion layer 8. When a voltage is applied to the first electrode 11 and the second electrode 13, charges generated in the photoelectric conversion layer 12 will move to the first electrode 11. The charges move to the $n^+$ region 2 through the contact part 7 from the first electrode 11, and are accumulated in the $n^+$ region 2. The contact part 7 and the adhesion layer 8 are embedded in a transparent insulating layer 6 made of $Si_3N_4$, which is formed on the silicon substrate 1.

Within the p-type silicon substrate 1 below each photoelectric conversion section, an n-type impurity region 3 (hereinafter referred to as "n region 3"), a p-type impurity region 4 (hereinafter referred to as "p region 4"), and an n-type impurity region 5 (hereinafter referred to as "n region 5") are formed sequentially from the surface side of the substrate 1. Since a pn junction formed between the n region 3 and the p region 4 is close to the surface portion of the silicon substrate 1, the light reaching the pn junction contains a blue (B) light component having a large optical absorption coefficient as its dominant light component. As a result, the pn junction constitutes a B photo electric converting element (photodiode), which detects the wavelength of a blue (B) light component of incident light. Since the pn junction formed between the n region S and the p-type silicon substrate 1 is in a deep portion of the silicon substrate 1, the light reaching this pn junction contains a red (R) light component having a small optical absorption coefficient as its dominant light component. As a result, the pn junction constitutes an R photoelectric converting element (photodiode), which detects the wavelength of a red (R) light component of incident light. Charges generated in the B photoelectric converting element are accumulated in the n region 3. Also, charges generated in the R photoelectric converting element are accumulated in the n region 5.

A signal reading unit (not shown) having a CCD or MOS circuit for reading signals according to the charges accumulated in the n+ region 2, the n region 3, and the n region 5 is formed in the p-type silicon substrate 1.

According to such a configuration, the solid-state imaging device 100 can detect the green (G) light component with the photoelectric conversion section disposed above the silicon substrate 1, and can detect the red (R) light component and the blue (B) light component with the photoelectric converting elements provided in the silicon substrate 1, to thereby generate a color image. In addition, not only the above combination but also various combinations may be employed for the wavelength of the light detected by the photoelectric conversion section disposed above the silicon substrate 1 and by the photoelectric converting elements provided in the silicon substrate 1.

Figure 2:
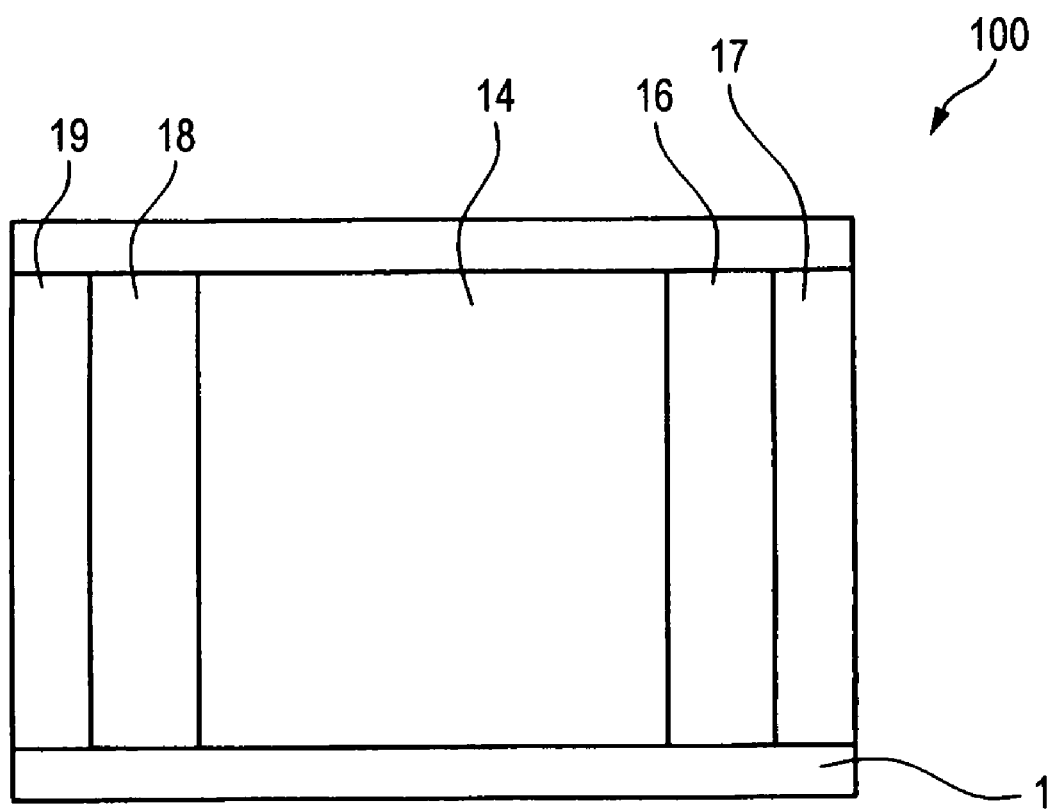
FIG. 2 is a schematic plan view of the solid-state imaging device according to the embodiment of the invention.
Figure 3A:
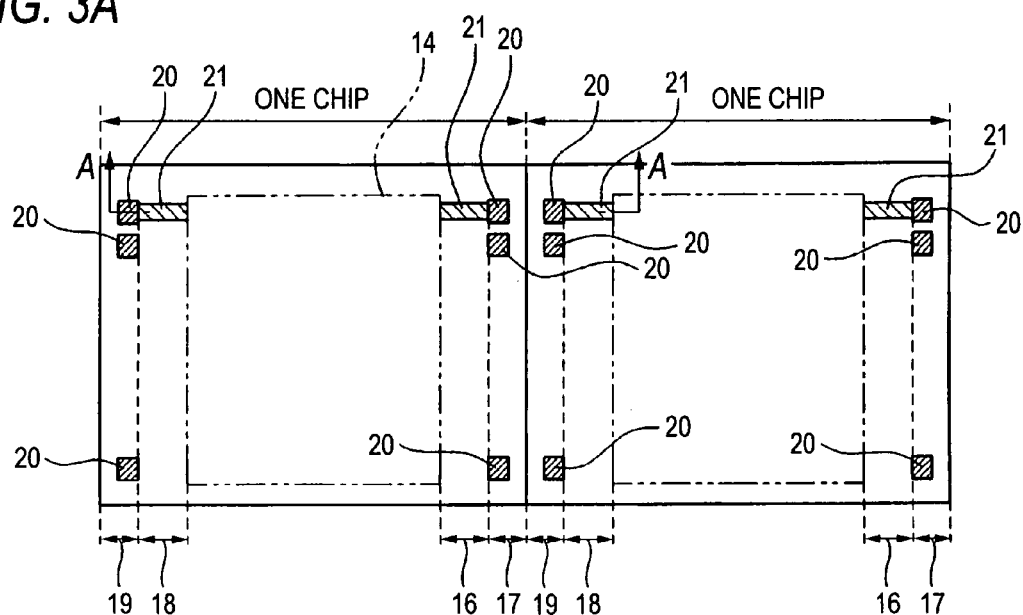
FIGS. 3A through 3C are views showing a state after each step in manufacturing the solid-state imaging device to describe the embodiment of the invention.
Figure 3B:
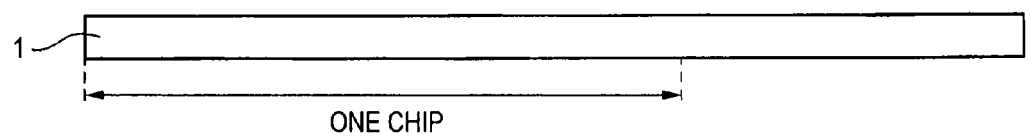
Figure 3C:
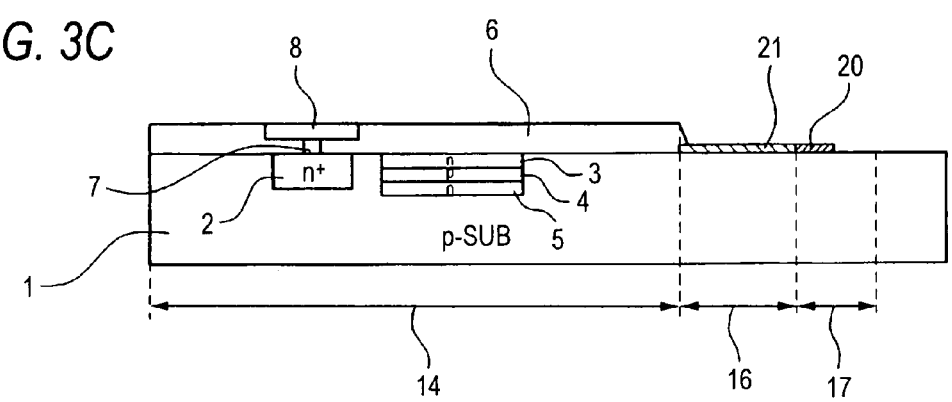
Figure 4A:
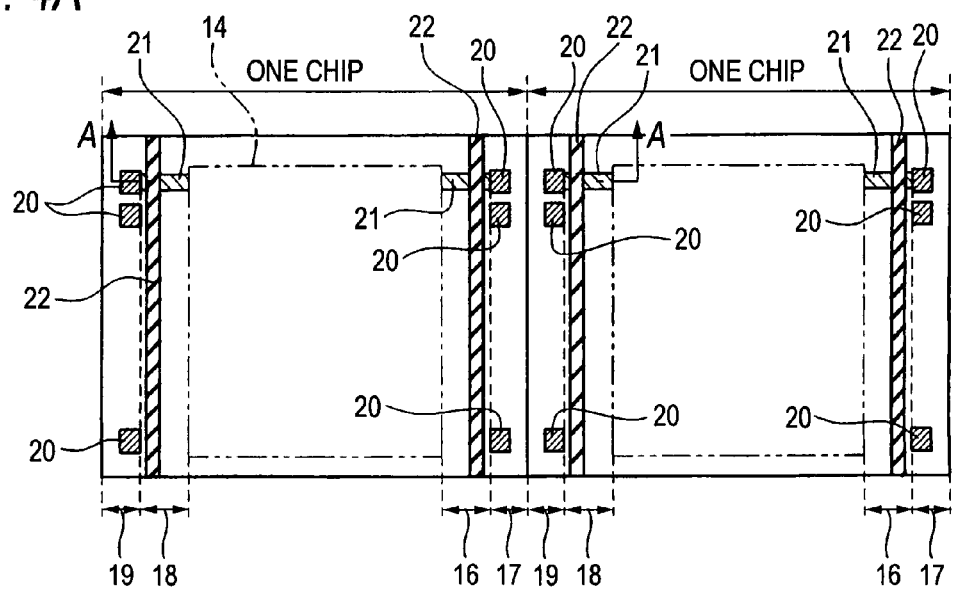
FIGS. 4A through 4C are views showing a state after each step in manufacturing the solid-state imaging device to describe the embodiment of the invention.
Figure 4B:
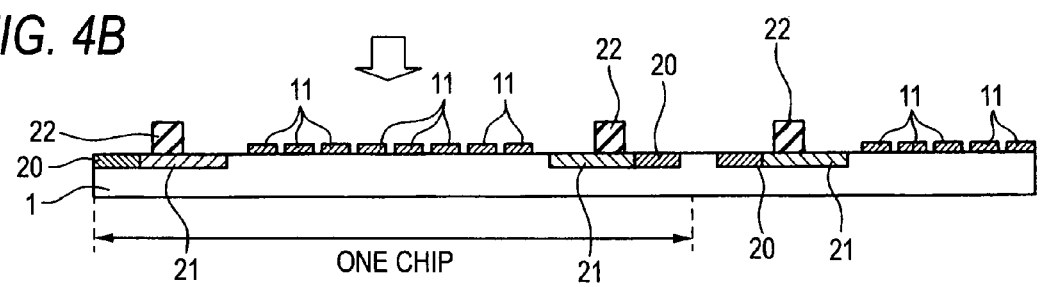
Figure 4C:
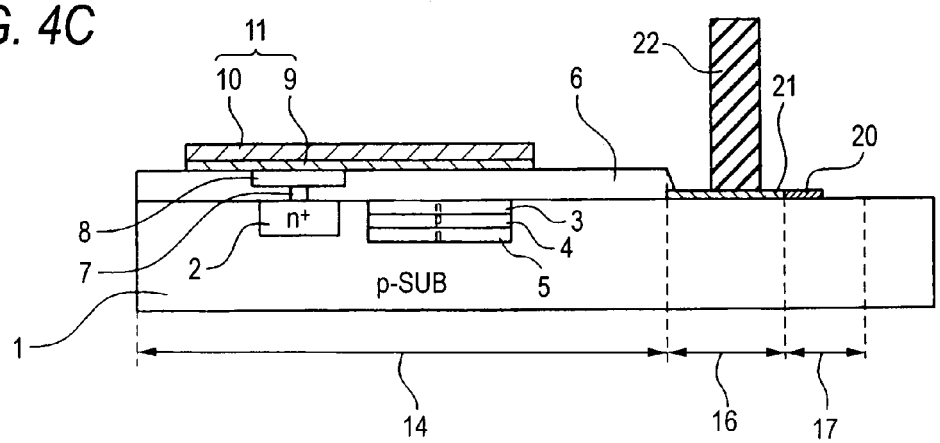
Figure 5A:
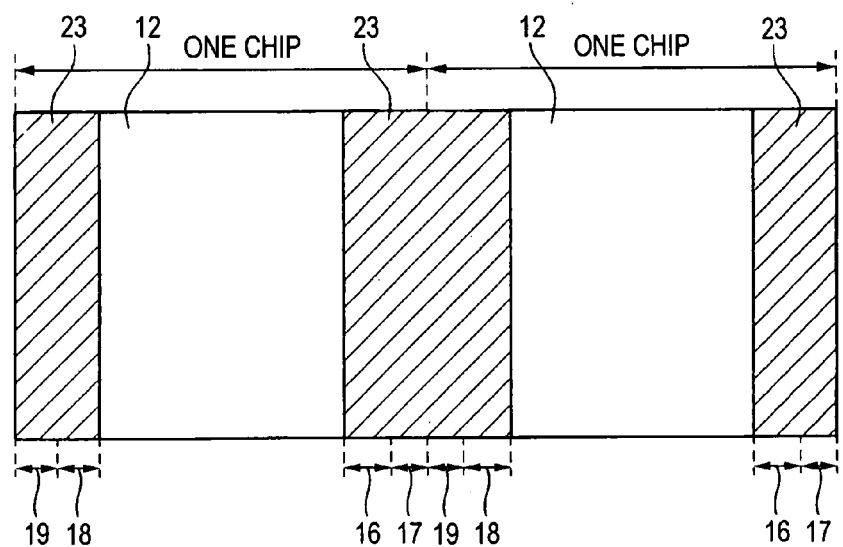
FIGS. 5A through 5C are views showing a state after each step in manufacturing the solid-state imaging device to describe the embodiment of the invention.
Figure 5B:
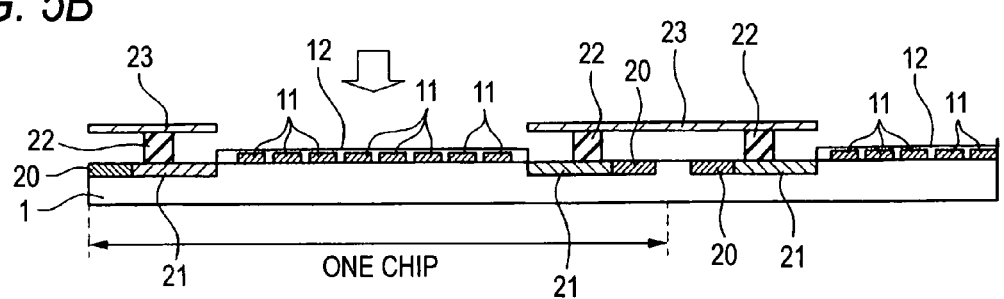
Figure 5C:
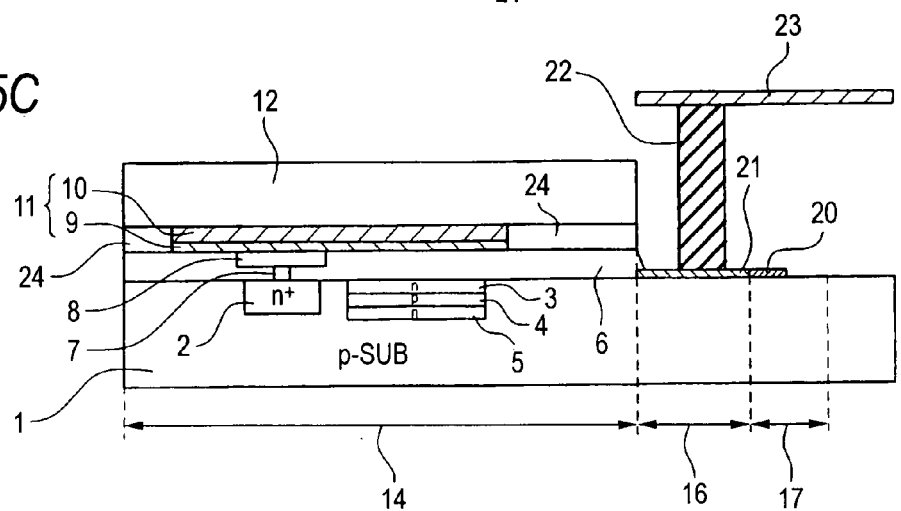
Figure 6A:
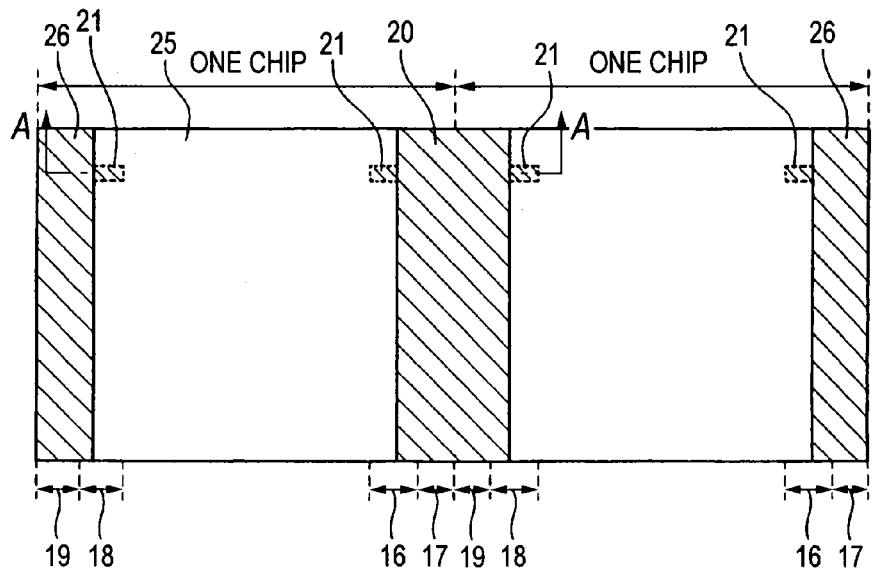
FIGS. 6A through 6C are views showing a state after each step in manufacturing the solid-state imaging device to describe the embodiment of the invention.
Figure 6B:
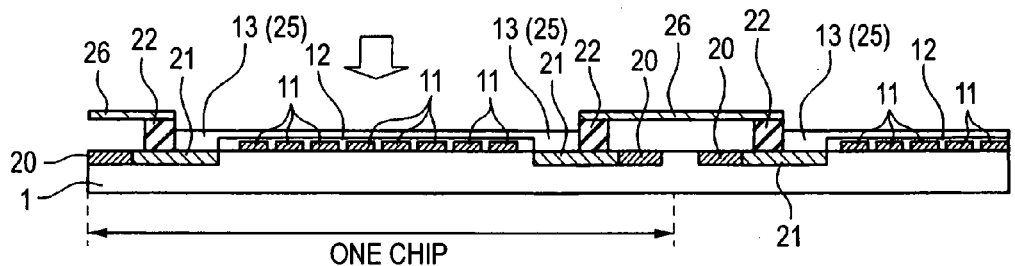
Figure 6C:
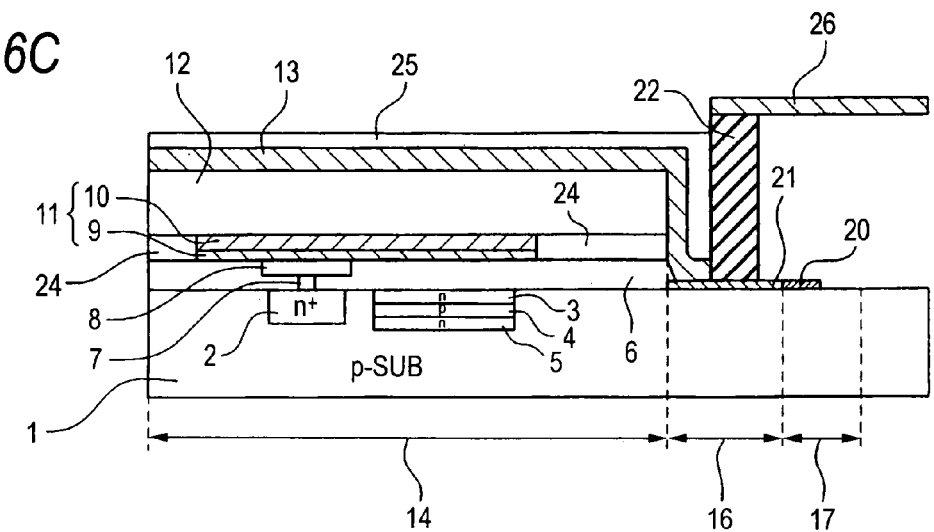

FIG. 2 is a schematic plan view of the solid-state imaging device to describe this embodiment.

The solid-state imaging device 100 in plan view includes: a photoelectric conversion region 14 in which the photoelectric conversion sections are formed; pad regions 17 and 19 in which a large number of electrode pads for connecting a power source to the solid-state imaging device 100 are formed; a boundary region 16 between the photoelectric conversion region 14 and the pad region 17; and a boundary region 18 between the photoelectric conversion region 14 and the pad region 19. One pad for the second electrode 13, which is an electrode pad for connecting the power source to the second electrode 13 in the photoelectric conversion region 14, is included in the large number of electrode pads formed in each of the pad region 17 and the pad region 19. An area of the photoelectric conversion region 14 in plan view is the same as that of the photoelectric conversion layer 12. The boundary regions 16, 18 in plan view are regions between (i) ends of the photoelectric conversion layer 12 and (ii) ends of electrode pads 20 on the photoelectric-conversion-region side.

Next, a method of manufacturing the solid-state imaging device 100 will be described. This manufacturing method is a method of simultaneously forming a plurality of the solid-state imaging devices 100 on one silicon wafer, and thereafter dicing the silicon wafer to separate the solid-state imaging devices 100 from one another, to thereby obtain each imaging device 100 made into one chip. Since the silicon substrate 1 shown in FIG. 1 corresponds to a silicon wafer, this silicon wafer will be described as the silicon wafer 1.

Figure 7A:
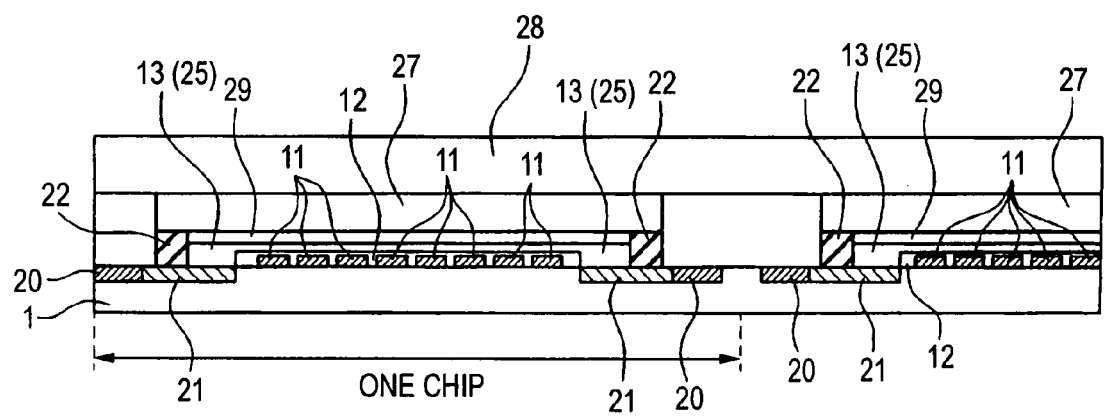
FIGS. 7A and 7B are views showing a state after each step in manufacturing the solid-state imaging device to describe the embodiment of the invention.
Figure 7B:
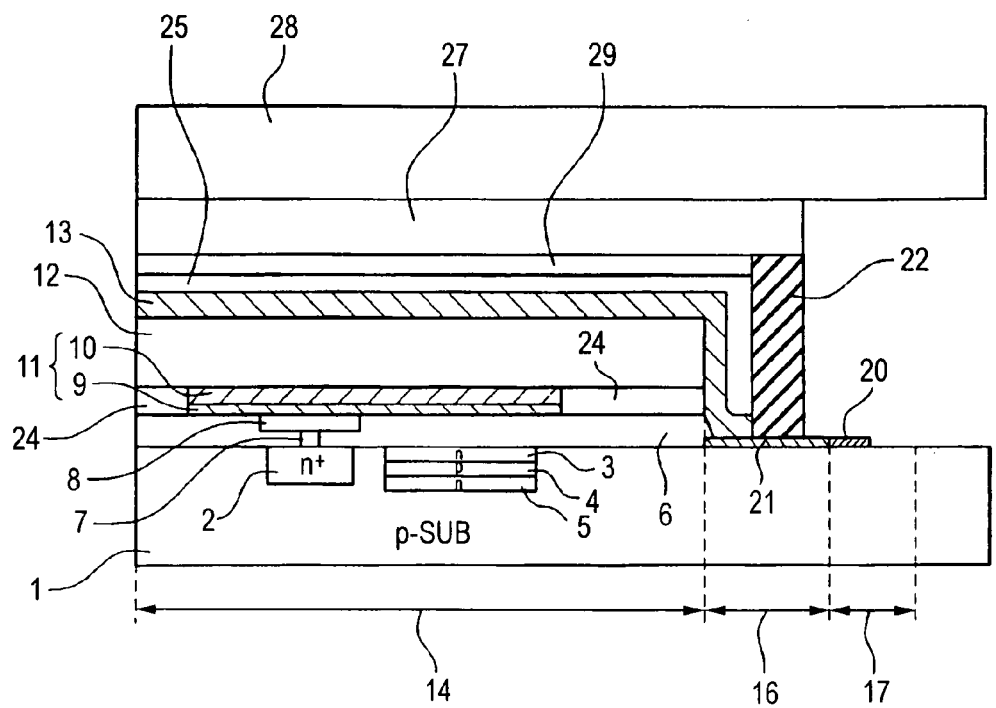
Figure 8A:
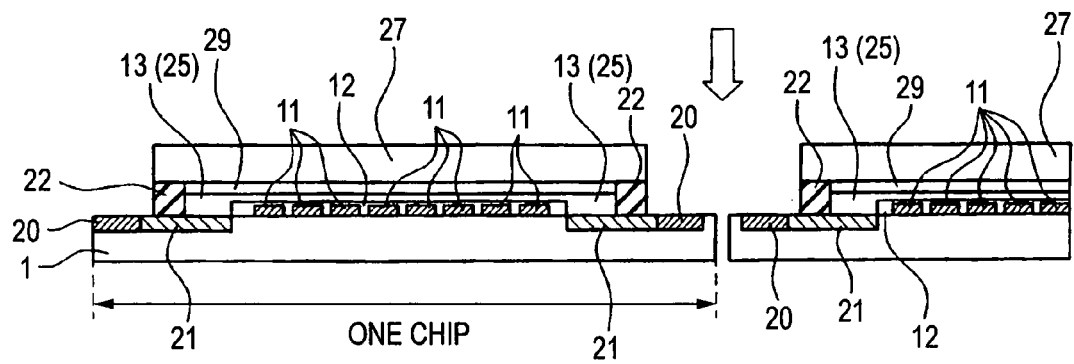
FIGS. 8A and 8B are views showing a state after each step in manufacturing the solid-state imaging device to describe the embodiment of the invention.
Figure 8B:
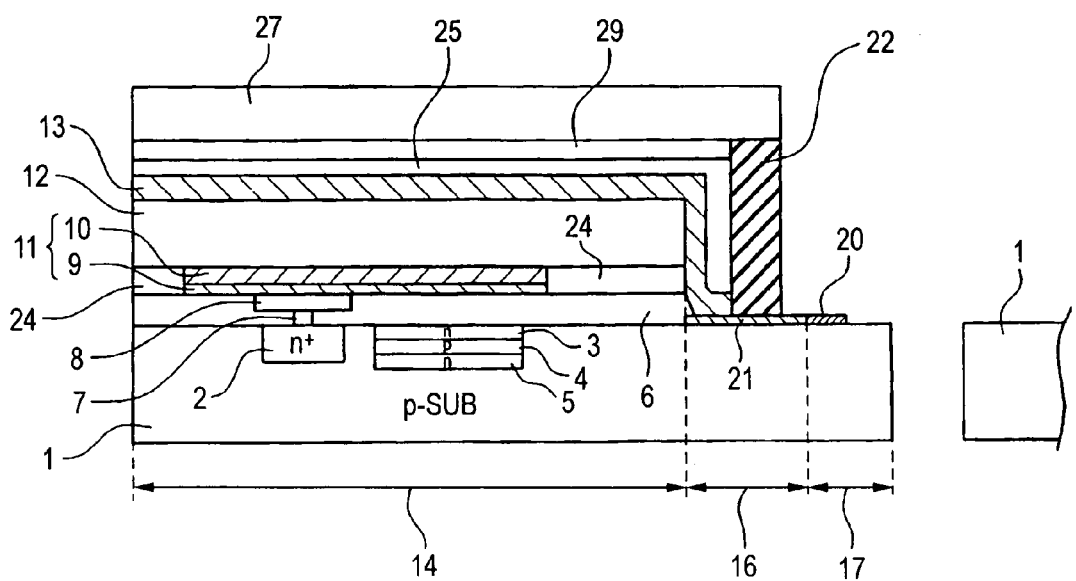

FIGS. 3 to 8 are views showing states after each manufacturing process of the solid-state imaging device 100. In FIGS. 3 to 6, FIG. 3A, FIG. 4A, FIG. 5A, and FIG. 6A are schematic plan views of two chips when a portion where one solid-state imaging device of the silicon wafer is formed considered as one chip. FIG. 3B, FIG. 4B, FIG. 5B, and FIG. 6B are cross-section schematic views taken along lines A-A in FIG. 3A, FIG. 4A, FIG. 5A, and FIG. 6A. FIG. 3C, FIG. 4C, FIG. 5C, and FIG. 6C are enlarged views of portions in the vicinity of the boundary regions 16 in the schematic section views shown in FIG. 3B, FIG. 4B, FIG. 5B, and FIG. 6B. In FIGS. 7 and 8, schematic plan views are omitted. FIGS. 7A and 8A are cross-section schematic views taken along lines A-A. FIGS. 7B and 8B are enlarged views of portions in the vicinity of the boundary regions 16 of the schematic section views shown in FIGS. 7A and 8A.

First, the n+ region 2, the regions 3 and 5, the p region 4 and the signal reading unit are formed in the silicon wafer 1 according to a well-known process. Next, a metal film such as aluminum is formed on the silicon wafer 1 by a sputtering method. This film is patterned by, for example, photolithography to form the contact part 7 on the n+ region 2, while the large number of electrode pads 20 (in FIG. 3, the electrode pad 20 located at the top is referred to as the "pad 20 for the second electrode") are formed on the silicon wafer 1 in each of the electrode pad regions 17 and 19. Further, a third electrode 21, which is formed in the pad region 16 and 18 adjacent to each of the electrode pad regions 17 and 19 and which is electrically connected to the pad 20 for the second electrode, is also formed on the silicon wafer 1 in each of the boundary regions 16 and 18 by this patterning. In addition, this third electrode 21 may be integrated with the pad 20 for the second electrode, or may be connected to the pad 20 for the second electrode via a wiring line.

Next, a film made of a material such as TiN or AlCu is formed by, for example, a sputtering method. This film is patterned by photolithography, to thereby form the adhesion layer 8 on the contact part 7. Next, a film made of an insulating material such as $Si_3N$ is formed. This film is planarized by, for example, a CMP method until the surface of the adhesion layer 8 is exposed, to thereby form the insulating layer 6. Next, the insulating layer 6 on the electrode pads 20 and on the third electrodes 21 are selectively removed by, for example, photolithography, to thereby expose the electrode pads 20 and the third electrodes 21. The state at this time is shown in FIG. 3.

Next, as shown in FIG. 4, separating members 22, which separate the pad regions 17 and 19 from the photoelectric conversion region 14, are formed on the third electrodes 21 in the boundary regions 16 and 18 and on the silicon wafer 1 in the boundary regions 16 and 18 so that an exposed surface of the third electrodes 21 exist between the separating members 22 and the photoelectric conversion region 14 in plan view. The separating members 22 have any height so long as the separating members 22 come to a position higher than the protective layer 25 as shown in FIG. 1. Any material may be employed as the separating member 22 so long as it can be formed with a certain degree of height. For example, a resist material, a metallic material, etc. may be used for the separating member. The separating member 22 is formed by, for example, photolithography.

Next, a film made of a material such as ITO is formed by vapor deposition. This film is patterned by, for example, photolithography, to thereby form the first electrodes 11 on the insulating layer 6, as shown in FIG. 4. If ITO is used as the material of the separating members 22, it is possible to form the first electrodes 11 and the separating members 22 simultaneously. Since the photoelectric conversion layer 12 has not yet been formed in the processes up to now, the photolithography can be used freely.

Next, a film made of an insulating material such as $Si_3N_4$ is formed. This film is planarized by, for example, a CMP method until the surfaces of the first electrodes 11 are exposed, to thereby form an insulating layer 24. Next, a first mask 23, which is made of metal and which defines openings only above the photoelectric conversion regions 14, is disposed on the separating members 22. Then, an organic photoelectric conversion material is vapor-deposited from above the first mask, to thereby form the photoelectric conversion layer 12 on the first electrodes 11 via the first mask 23. A state after the forming of the photoelectric conversion layer 12 is shown in FIG. 5.

Next, the first mask 23 is removed. Then, a second mask 26, which defines openings above the photoelectric conversion regions 14 and an above exposed surface of the third electrode 21 located between the separating members 22 and the photoelectric conversion regions 14 in plan view, is disposed on the separating members 22. A transparent electrode material, such as ITO, is vapor-deposited from above the second mask, to thereby form the second electrodes 13 on the photoelectric conversion layer 12 and on the exposed surfaces of the third electrodes 21, which further protrudes toward the photoelectric conversion region 14 than the separating member 22 in plan view, via the second mask 26. This makes it possible to electrically connect each second electrode 13 to the pad 20 for the second electrode via the third electrode 21. Next, a transparent resin material is vapor-deposited from above the second mask 26, to thereby form the protective layer 25 on the second electrode 13 via the second mask 26. A state after the formation of the protective layer 25 is shown FIG. 6.

Next, cover glasses 27 are temporarily fixed to the surface of the glass substrate 28 having the same size of the silicon wafer 1, in positions corresponding to the respective chips of the silicon wafer 1. Next, adhesive 29 is applied on the protective layer 25, and the cover glasses 27 are placed on the separating members 22 and the adhesive 29, to thereby adhere the cover glasses 27 to the protective layer 25 (FIG. 7). The size of the cover glass 27 in plan view is equal to the sum of the size (in plan view) of the protective layer 25 formed in one chip and the size (in plan view) of the pair of separating members 22 formed on both sides of the protective layer 25. The cover glasses 27 function as a transparent protective member for protecting a region on the photoelectric-conversion-region side of the separating member 22 in one solid-state imaging device 100.

Next, the glass substrate 28 is removed, and dicing is performed using a boundary between chips as a dicing line, to thereby obtain a solid-state imaging device 100 made into one chip (FIG. 8).

The solid-state imaging device 100 made into one chip is mounted on a circuit board by a well-known technique. As a mounting method, there is a method of packaging the solid-state imaging device 100 made into one chip to fix it on a circuit board, and thereafter establishing an electrical connection between the solid-state imaging device 100 and the circuit board. Further, since the solid-state imaging device 100 made into one chip is already provided with cover glass, there is also a method of mounting the above chip on a circuit board as a bear chip without packaging. Further, as a method of establishing an electrical connection between the solid-state imaging device 100 and the circuit board, there is a method of connecting wiring lines to exposed electrode pads from their surfaces, a method of forming through-holes extending from the surface of the silicon substrate 1 opposite to its surface on which a device are formed to the electrode pads 20, then forming wiring lines in the through-holes to obtain through wiring lines, and then electrically connecting the solid-state imaging device with a circuit board with the through wiring lines, or the like.

As described above, the manufacturing method described in this embodiment includes exposing the electrode pads 20 and the third electrode 21 by the photolithography, and thereafter covering the exposed portions with the first mask 23 to form the photoelectric conversion layer 12 via the first mask 23. Therefore, after the forming of the photoelectric conversion layer 12, an electrical connection between the second electrode 13 and the pad 20 for the second electrode is realized without using the photolithography by forming the second electrode 13 using the second mask 26 as described above. That is, a product can be finished without using the photolithography after the forming of the photoelectric conversion layer 12, and thus degradation of the performance of the photoelectric conversion layer 12 can be prevented.

In the above description, the first mask 23 defines the openings only above the photoelectric conversion regions 14. However, any mask may be employed as the first mask 23 so long as it can prevent the photoelectric conversion material from being vapor-deposited on the large number of electrode pads 20 and the exposed surface of the third electrodes 21, and it allows to vapor-deposit the photoelectric conversion material on the photoelectric conversion region 14. For this reason, any mask may be employed as the first mask 23 so long as it covers at least the exposed surface of the third electrode 21 and the exposed surfaces of the large number of electrode pads 20 among regions other than the photoelectric conversion region 14.

Further, in the above description, the second mask 26 defines the openings above the photoelectric conversion region 14 and above the exposed surface of the third electrodes 21 between the separating members 22 and the photoelectric conversion regions 14. However, any mask may be employed as the second mask 26 so long as it can prevent the material of the second electrode 13 from being vapor-deposited on the exposed surfaces of the large number of electrode pads 20, and it allows to vapor-deposit the material of the second electrode 13 on the photoelectric conversion region 14 and on at least a portion of the exposed surface of the third electrodes 21 between the separating members 22 and the photoelectric conversion regions 14. Therefore, any mask may be employed as the second mask 26 so long as it covers the exposed surfaces of the large number of electrode pads 20 among regions other than the photoelectric conversion region 14 and other than at least a portion of the exposed surface of the third electrodes 21 between the separating members 22 and the photoelectric conversion regions 14.

Further, in the above description, the separating members 22 are formed in order to fix the first mask 23 and the second mask 26. However, the first and second masks may not be fixed using the separating member 22. In this case, a mechanism, which fixes the first mask 23 and the second mask 26, may be provided in an apparatus, which vapor-deposits the material of the photoelectric conversion layer 12, the material of the second electrode 13, and the material of the protective layer 25. Here, when the material of the second electrode 13 is vapor-deposited without using the separating members 22, there is a possibility that this material may flow into the large number of electrode pads 20, causing short-circuiting. In the case where the separating member 22 is provided like this embodiment, there is an advantage in that such a situation can be prevented surely.

Further, in the case where the separating members 22 are provided like this embodiment, there is also an advantage that the photoelectric conversion sections can be sealed along with the cover glasses 27, and it is not necessary to perform a packaging process after the solid-state imaging device 100 is made into one chip.

Further, when metal is used as the material of the separating members 22, even if the second electrode 13 make a poor contact with the third electrode 21, the second electrode can be electrically connected with the pad 20 for the second electrode via the separating member 22. Consequently, the yield can be enhanced.

Figure 9A:
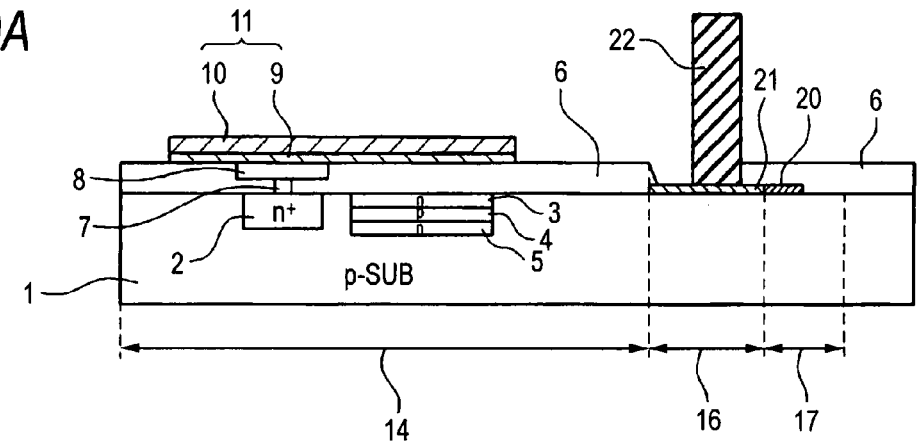
FIGS. 9A through 9C are views showing a state after each step in manufacturing the solid-state imaging device to describe the embodiment of the invention.
Figure 9B:
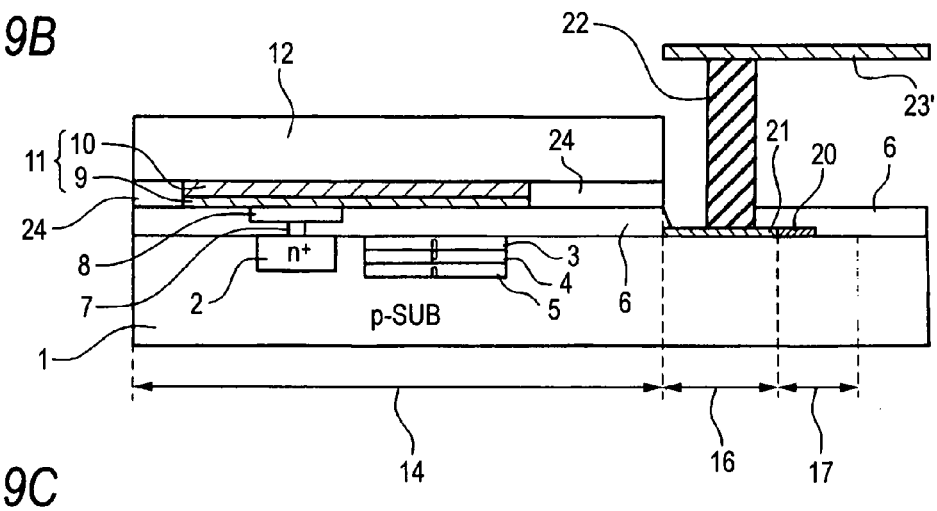
Figure 9C:
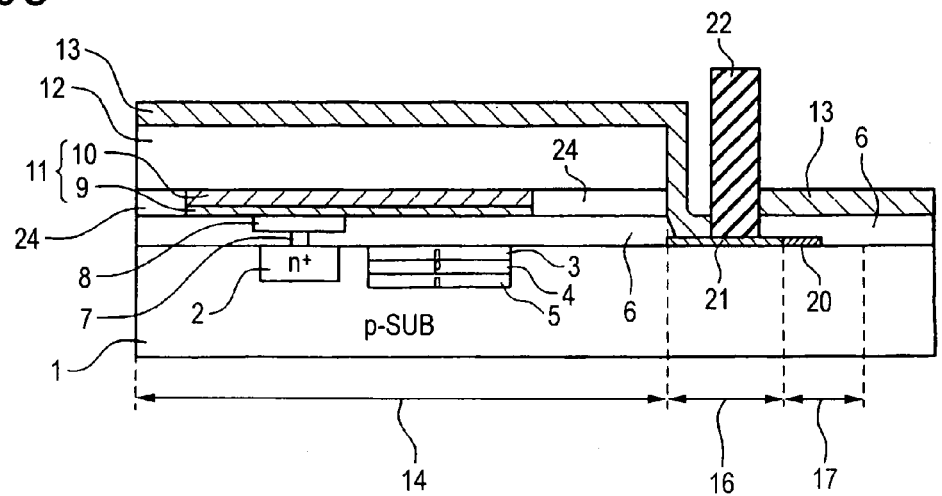

Further, in the case where a connection between a circuit board and the electrode pads 20 is realized using the through wiring lines, the second mask 26 may not be used in the manufacturing method. In this case, as shown in FIG. 9A, after the insulating layer 6 is formed on the third electrode 21 and the electrode pads 20, an opening is formed only in the third electrode 21 of the insulating layer 6 to expose a portion of the third electrode 21. Then, the separating member 22 is formed on the third electrode 21. The separating member 22 in plan view is formed so that the exposed surface of the third electrode 21 exists on the photoelectric-conversion-region side of the separating member 22. Next, as shown in FIG. 9B, after the insulating layer 24 is formed, the photoelectric conversion layer 12 is formed via a first mask 23', which covers at least the exposed surface of the third electrode 21 among regions other than the photoelectric conversion region 14. Next, the first mask 23' is removed and then, the second electrode 13 is formed over the entire silicon wafer 1 as shown in FIG. 9C. At this time, although the second electrode 13 is formed even on the electrode pads 20, the electrode pads 20 do not cause short-circuiting because they are not exposed. By doing in this way, using the second mask 26 can be omitted, and thus the time and cost relating to preparation and alignment of the second mask 26 can be reduced.

Figure 10A:
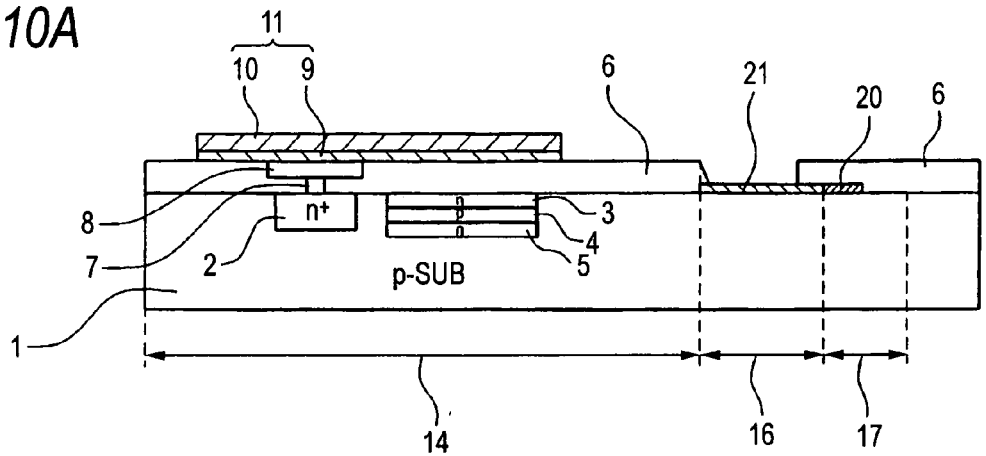
FIGS. 10A through 10C are views showing a state after each step in manufacturing the solid-state imaging device to describe the embodiment of the invention.
Figure 10B:
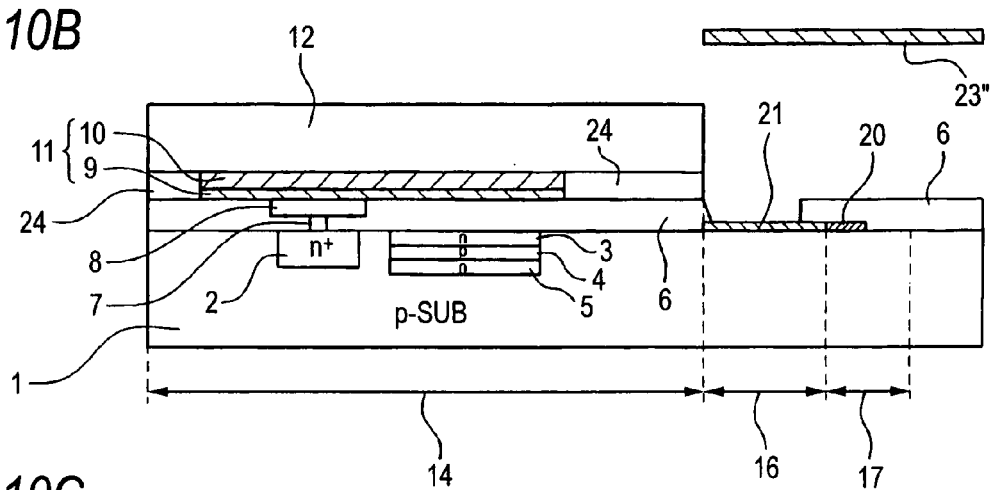
Figure 10C:
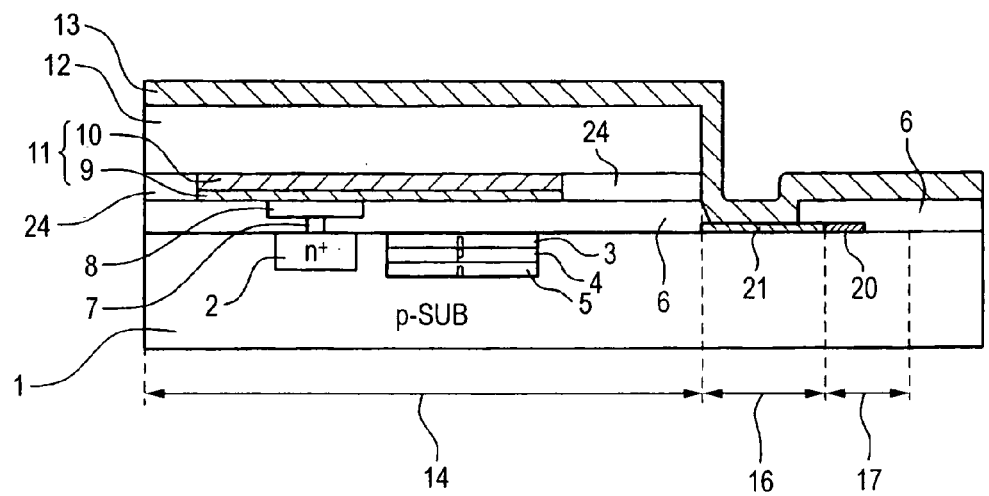

Further, in the case where the through wiring lines are used, the separating member 22 may be omitted in the manufacturing method. In this case, as shown in FIG. 10A, after the insulating layer 6 is formed on the third electrode 21 and the electrode pads 20, an opening is formed only above the third electrode 21 of the insulating layer 6 to expose at least a portion of the third electrode 21. Next, as shown in FIG. 10B, after the insulating layer 24 is formed, a first mask 23", which covers at least the exposed surface of the third electrode 21 among regions other than the photoelectric conversion region 14 is placed in a vapor deposition apparatus, to thereby form the photoelectric conversion layer 12 via the first mask 23". Next, the first mask 23" is removed and then, the second electrode 13 is formed over the entire silicon wafer 1 as shown in FIG. 10C. At this time, although the second electrode 13 is formed even on the electrode pads 20, the electrode pads 20 do not cause short-circuiting because they are not exposed. By doing in this way, using the second mask 26 and the separating member 22 can be omitted, and thus the time and cost relating to preparation and alignment of the separating member 22 and the second mask 26 can be reduced.

Further, in the case where the separating member 22 is not used, the forming of the third electrode 21 may also be omitted. In this case, when an opening is formed in the insulating layer 6, the opening is formed only above the pad 20 for the second electrode, and at least a portion of each of the pad 20 for the second electrode is exposed. Then, the photoelectric conversion layer 12 is formed via a mask, which covers at least an exposed surface of the pad 20 for the second electrode among regions other than photoelectric conversion region 14, and thereafter, the mask is removed and the second electrode 13 is formed over the entire silicon wafer 1.

Further, it is also conceivable that the separating member 22 and the third electrode 21 are not used. Furthermore, the through wiring lines are not used. In this case, an opening is formed in the insulating layer 6 to expose at least a portion of each of the large number of electrode pads 20. Next, the photoelectric conversion layer 12 is formed via a first mask, which covers at least the exposed surface of each of the large number of electrode pads 20 among regions other than the photoelectric conversion region 14. Then, the photoelectric conversion layer 12 is formed. Thereafter, the second electrode 13 is formed on an exposed surface of the photoelectric conversion layer 12 and at least a portion of an exposed surface of the pad 20 for the second electrode, via a second mask which covers at least the exposed surface of each of the large number of electrode pads 20 other than the pad 20 for the second electrode among the regions other than the photoelectric conversion region 14 and at least a portion of the pad 20 for a second electrode.

Further, in the above description, the case where the B photoelectric converting element and the R photoelectric converting element are formed in the silicon substrate 1 below the photoelectric conversion layer 12. However, the effects according to the above manufacturing method can be acquired if a solid-state imaging device configured such that a photoelectric conversion section is laminated as one layer above the silicon substrate 1 is employed. For example, in FIG. 1, a configuration in which the n regions 3 and 5 and the p region 4 are eliminated may be employed.

What is claimed is:

1. A method of manufacturing a solid-state imaging device in which a large number of photoelectric conversion sections each comprising a first electrode laminated above a substrate, a photoelectric conversion layer formed on the first electrode, and a second electrode formed on the photoelectric conversion layer are arranged on a same plane above the substrate, wherein:
the first electrode is partitioned for each of the large number of photoelectric conversion sections,
the second electrode is common to the large number of photoelectric conversion sections,
the solid-state imaging device in plan view has a photoelectric conversion region in which the photoelectric conversion sections are formed, and a pad region in which a large number of electrode pads for connecting a power source to the solid-state imaging device are formed, and
the large number of electrode pads include a pad for the second electrode that connects the power source to the second electrode, and other electrode pads, the manufacturing method comprising:
forming the first electrode above the substrate;
forming on the substrate the pad for the second electrode so that at least a portion of the pad for the second electrode is exposed;
forming the photoelectric conversion layer on the first electrode via a first mask that covers at least the exposed surface of the pad for the second electrode in regions other than the photoelectric conversion region.

2. The method according to claim 1, further comprising:
forming the other electrode pads on the substrate so that at least portions of the other electrode pads are exposed, wherein:
the forming of the photoelectric conversion layer forms the photoelectric conversion layer with using, as the first mask, a mask that at least covers the exposed surface of the pad for the second electrode and the exposed surfaces of the other electrode pads in the regions other than the photoelectric conversion region, the method further comprising:
after the forming of the photoelectric conversion section, forming the second electrode on the photoelectric conversion layer and on at least a portion of the exposed surface of the pad for the second electrode, via a second mask that at least covers the exposed surfaces of the other electrode pads in the regions other than the photoelectric conversion region and other than at least a portion of the exposed surface of the pad for the second electrode.

3. A method of manufacturing a solid-state imaging device in which a large number of photoelectric conversion sections each comprising a first electrode laminated above a substrate, a photoelectric conversion layer formed on the first electrode, and a second electrode formed on the photoelectric conversion layer are arranged on a same plane above the substrate, wherein:

the first electrode is partitioned for each of the large number of photoelectric conversion sections, the second electrode is common to the large number of photoelectric conversion sections, the solid-state imaging device in plan view has a photoelectric conversion region in which the photoelectric conversion sections are formed, a pad region in which a large number of electrode pads for connecting a power source to the solid-state imaging device are formed, and a boundary region between the photoelectric conversion region and the pad region, and the large number of electrode pads include a pad for the second electrode that connects the power source to the second electrode, and other electrode pads, the method comprising:

forming the first electrode above the substrate;

forming the large number of electrode pads on the substrate;

forming a third electrode, which is to be electrically connected to the pad for the second electrode, on the substrate in the boundary region so that at least a portion of the third electrode is exposed;

forming a separating member, which separates the photoelectric conversion region and the pad region, on the third electrode and the substrate in the boundary region so that the exposed surface of the third electrode exists between the separating member and the photoelectric conversion region in plan view;

placing on the separating member a first mask that covers at least a portion of the exposed surface of the third electrode in regions other than the photoelectric conversion region; and forming the photoelectric conversion layer on the first electrode via the first mask.

4. The method according to claim 3, wherein:

the forming of the electrode pads forms the large number of electrode pads so that at least a portion of each of the large number of electrode pads is exposed, and the forming of the photoelectric conversion layer forms the photoelectric conversion layer on the first electrode with using, as the first mask, a mask that at least covers the third electrode and the exposed surfaces of the large number of electrode pads in the regions other than the photoelectric conversion region, the method further comprising:

after the forming of the photoelectric conversion layer, placing on the separating member a second mask that at least covers the exposed surfaces of the large number of electrode pads in the regions other than the photoelectric conversion region and other than at least a portion of the exposed surface of the third electrode between the separating member and the photoelectric conversion region; and forming the second electrode on the photoelectric conversion layer and on at least the portion of the exposed surface of the third electrode between the photoelectric conversion region and the separating member via the second mask.

5. The method according to claim 4, wherein:

the pad region includes a first pad region and a second pad region, which face each other across the photoelectric conversion region, the method further comprising:

forming a transparent protective member on the separating member formed in the boundary region so that the transparent protective member protects a region on a photoelectric-conversion-region side of the separating member.

6. The method according to claim 5, further comprising:

forming a plurality of the solid-state imaging devices in a same wafer; and dicing the wafer to separate the plurality of solid-state imaging devices.

7. The method according to claim 6, wherein a metal is used as the separating member.

8. The method according to claim 5, wherein a metal is used as the separating member.

9. The method according to claim 4, wherein a metal is used as the separating member.

10. The method according to claim 3, wherein:

the pad region includes a first pad region and a second pad region, which face each other across the photoelectric conversion region, the method further comprising:

forming a transparent protective member on the separating member formed in the boundary region so that the transparent protective member protects a region on a photoelectric-conversion-region side of the separating member.

11. The method according to claim 10, further comprising:

forming a plurality of the solid-state imaging devices in a same wafer; and dicing the wafer to separate the plurality of solid-state imaging devices.

12. The method according to claim 11, wherein a metal is used as the separating member.

13. The method according to claim 10, wherein a metal is used as the separating member.

14. The method according to claim 3, wherein a metal is used as the separating member.

* * * * *